United States Patent
Kanai

[19]

[11] Patent Number: 5,865,359
[45] Date of Patent: Feb. 2, 1999

[54] TAPE FEEDER WITH CONTROLLED FEED MOTION

[75] Inventor: Takeshi Kanai, Gunma-ken, Japan

[73] Assignee: Sanyo Electric Co., Ltd, Osaka-fu, Japan

[21] Appl. No.: 667,917

[22] Filed: Jun. 20, 1996

[30] Foreign Application Priority Data

Jun. 22, 1995 [JP] Japan .................................. 7-156206

[51] Int. Cl.[6] .................................................. B65H 20/00
[52] U.S. Cl. ........................ 226/122; 226/159; 226/164; 226/165
[58] Field of Search .................................. 226/122, 158, 226/159, 160, 162, 163, 164, 165

[56] References Cited

U.S. PATENT DOCUMENTS

| | | | |
|---|---|---|---|
| 1,128,861 | 2/1915 | Fisher | 226/165 |
| 1,670,006 | 5/1928 | Prym | 226/165 |
| 1,786,867 | 12/1930 | Rosenthal | 226/165 |
| 3,161,338 | 12/1964 | Grimm | 226/163 |
| 3,203,608 | 8/1965 | Mogolis | 226/165 |
| 3,750,921 | 8/1973 | Bundschuh | 226/122 |
| 4,789,418 | 12/1988 | Rayl | 226/162 |
| 5,163,595 | 11/1992 | Messner | 226/160 |
| 5,342,474 | 8/1994 | Mohara et al. | 156/584 |
| 5,399,060 | 3/1995 | Richert | 226/165 |

FOREIGN PATENT DOCUMENTS

| | | |
|---|---|---|
| 5-90786 | 9/1991 | Japan . |
| 5-175687 | 7/1993 | Japan . |
| 0722553 | 1/1955 | United Kingdom ................... 226/122 |

*Primary Examiner*—Charles A. Marmor
*Assistant Examiner*—Matthew A. Kaness
*Attorney, Agent, or Firm*—Darby & Darby

[57] ABSTRACT

A tape feeder has a driving member which performs reciprocating motion, and a tape-advancing mechanism driven by the driving member for intermittently advancing a tape containing electronic parts to thereby position each of the electronic parts at a predetermined takeout position. The tape-advancing mechanism comprises a driving force-converting device for converting a driving force received from the driving member to a driving force for use in tape-advancing motion of the tape-advancing mechanism, such that speed of the tape-advancing motion is varied as the tape-advancing mechanism is driven by the driving member.

16 Claims, 7 Drawing Sheets

TAPE FEEDER WITH CONTROLLED FEED MOTION

BACKGROUND OF THE INVENTION

1. Field of the Invention

This invention relates to a tape feeder for intermittently advancing a tape containing electronic parts by means of a tape-advancing mechanism driven by a driving member which moves in a reciprocating manner, thereby positioning each electronic part at a predetermined takeout position.

2. Prior Art

A tape feeder of this kind is disclosed in Japanese Laid-Open Patent Publication (Kokai) No. 5-90786. According to the prior art tape feeder employed in an automatic electronic parts-mounting apparatus, the tape-advancing mechanism of the tape feeder operates in the following manner: As a rod is driven for vertical reciprocating motion, a swing lever is detachably engaged with the rod and driven thereby for performing swinging motion. The swinging motion of the swing lever is transmitted to an advancing lever by way of a transmission lever, and the advancing lever moves an advancing pawl to rotate a sprocket via an advancing gear in engagement with the advancing pawl, thereby advancing a tape. In stopping the advancing or feeding of the tape, the advancing pawl is caused to abut a feed stopper, whereby the tape is positioned at a predetermined location.

The reason for positioning the tape by bringing the advancing pawl into abutment with the feed stopper is as follows: Usually, a plurality of tape feeders, which are optionally replaceable, are arranged in parallel with each other at a parts-feeding block of the automatic electronic parts-mounting apparatus. Therefore, even if the tape is to be positioned according to a lower limit position of the rod which performs the vertically reciprocating motion, the advancing pawl is not necessarily stopped at a predetermined point where it should be stopped due to variation in the lower limit position of each rod and variation in the position and operation of the other component parts of each tape feeder. To overcome this inconvenience, the advancing pawl is forcedly stopped. The vertically reciprocating rod is displaced downward by way of a spring, and hence its downward movement can be absorbed wherever the tape-advancing motion of the tape-advancing mechanism of the apparatus may be stopped.

In the proposed tape feeder, the rod is driven by a cam for reciprocating motion, which is rotated in synchronism with intermittent rotation of a rotary table of the automatic electronic parts-mounting apparatus. At a point where the rod strikes the swing lever, the rod is moving downward at a fairly high speed, so that striking of the rod against the swing lever causes a shock and vibrations to the tape-advancing mechanism, which adversely affects the parts feeding operation of the tape feeder.

Further, the limit of feed or advance of the tape for positioning the chip is set by the stopper which the advancing pawl abuts to stop the tape-advancing operation in a forced manner. When the tape-advancing operation is about to be stopped, the tape-advancing mechanism is operating at a fairly high speed with inertia, and then the tape-advancing operation is suddenly stopped. Therefore, even if the downward movement of the rod is absorbed or a shock caused thereby is softened by the spring, a shock or impact of the striking of the advancing pawl on the stopper is still large, so that the position or orientation of the electronic part contained in the tape can be made unstable, resulting in instability of the following operation of taking out or sucking the electronic part.

Further, recently, the speed of parts-mounting operation of a parts-mounting apparatus is getting higher and higher, and accordingly, the driving member strikes the swing lever at a higher speed and the advancing pawl abuts or strikes the stopper at a higher speed. This makes the above-described inconveniences too serious to ignore, because the shock resulting from the abutment or collision is increased in proportion to the second power of the speed increased, so that vibrations of the tape feeder, which are conventionally fully damped before the part is taken out or sucked from the tape, are also difficult to be damped.

SUMMARY OF THE INVENTION

It is the object of the invention to provide a tape feeder which is capable of reducing a shock generated when a tape-advancing operation of the tape feeder is started and stopped.

To attain the above object, the present invention provides a tape feeder having a driving member which performs reciprocating motion, and a tape-advancing mechanism driven by the driving member for intermittently advancing a tape containing electronic parts to thereby position each of the electronic parts at a predetermined takeout position.

The tape feeder according to the invention is characterized in that the tape-advancing mechanism comprises driving force-converting means for converting a driving force received from the driving member to a driving force for use in tape-advancing motion of the tape-advancing mechanism for advancing the tape, such that the speed of the tape-advancing motion is varied as the tape-advancing mechanism is driven by the driving member.

According to the tape feeder of the present invention, the driving force-converting means of the tape-advancing mechanism converts the driving force received from the driving member into the driving force or use in the tape-advancing motion of the tape-advancing mechanism such that speed of the tape-advancing motion is varied as the tape-advancing mechanism is driven by the driving member. Therefore, the driving force received from the driving member does not directly act on the associated parts and elements for the tape-advancing operation, which makes it possible to prevent a large shock or impact from being applied to the associated parts and elements. Particularly, it is possible to reduce the shock or impact applied to the tape-advancing mechanism when the tape-advancing operation is started and terminated.

Preferably, the driving force-converting means converts the driving force received from the driving member into the driving force for use in the tape-advancing motion of the tape-advancing mechanism, such that the tape-advancing motion of the tape-advancing mechanism is smoothly accelerated when the tape-advancing motion of the tape-advancing mechanism is started.

According to this preferred embodiment, the driving force-converting mechanism causes smooth acceleration of the tape-advancing motion of the tape-advancing mechanism when it is started. Therefore, the tape-advancing operation is started without a shock.

Preferably, the driving force-converting means converts the driving force received from the driving member into the driving force for use in tape-advancing motion of the tape-advancing mechanism, such that the tape-advancing motion of the tape-advancing mechanism is smoothly decelerated when the tape-advancing motion of the tape-advancing mechanism is stopped.

According to this preferred embodiment, the driving force-converting mechanism causes smooth deceleration of the tape-advancing motion of the tape-advancing mechanism when it is terminated. Therefore, the tape-advancing operation is stopped without a shock to thereby make it possible to take out the electronic part in a stable manner.

Preferably, the tape-advancing mechanism includes an engaging member with which the driving member detachably engages for displacing the engaging member, and the driving force-converting means absorbs the driving force received from the driving member when the driving member starts displacing the engaging member such that displacement of the engaging member occurring at or in the vicinity of a position at which the driving member in engagement with the engaging member starts displacing of the engaging member does not cause the tape-advancing motion of the tape-advancing mechanism.

According to this preferred embodiment, even if the driving member is brought into engagement with the engaging member to displace the same, the driving force of displacement of the engaging member is absorbed by the driving force-converting means so long as the engaging member is at or in the vicinity of the position at which the driving member starts displacing of the engaging member, but thereafter transmitted to the component parts and elements of the tape-advancing mechanism positioned at the latter stages than the driving force-converting means. Therefore, the tape-advancing operation is started without transmitting the impact upon striking of the driving member against the engaging member to the component parts and elements of the tape-advancing mechanism positioned at the latter stages than the driving force-converting means. This prevents a shock or impact from being applied to the electronic parts when the tape starts to be advanced.

Preferably, the tape-advancing mechanism includes an engaging member with which the driving member detachably engages for displacing the engaging member, and wherein the driving force-converting means absorbs the driving force received from the driving member when the driving member terminates displacing the engaging member such that displacement of the engaging member occurring at or in the vicinity of a position at which the driving member in engagement with the engaging member terminates displacing of the engaging member does not cause the tape-advancing motion of the tape-advancing mechanism.

According to this preferred embodiment, the driving member is engaged with the engaging member to displace the same, and the displacement of the engaging member is absorbed by the driving force-converting means so long as the engaging member is at or in the vicinity of the position at which the driving member terminates displacing of the engaging member, but not transmitted to the component parts and elements of the tape-advancing mechanism positioned at latter stages than the driving force-converting means. Therefore, the tape-advancing operation is stopped to position the tape at the predetermined stop position. This makes it possible to terminate the tape-advancing operation without a shock irrespective of variation in the stop position of the driving member.

Preferably, the driving force-converting means includes a driving-side member formed with a cam surface, and a driven-side member provided with a cam follower which is engaged with the cam surface for displacement, the cam surface having a profile formed such that, as the tape-advancing mechanism is driven by the driving member, the speed of the tape-advancing motion of the tape-advancing mechanism is varied.

According to this preferred embodiment, when the tape-advancing mechanism is driven by the driving member, the cam follower in engagement with cam surface formed on the driving-side member of the driving force-converting means is displaced to transmit the motion to the component parts and elements of the tape-advancing mechanism positioned at the latter stages than the driving force-converting means. This causes the tape-advancing motion to be performed at a speed corresponding to the profile. Since the speed of the tape-advancing motion is controlled by the cam, it is possible to select a desired speed variation curve according to which the speed of the tape-advancing motion is varied, thereby complying with various requirements or circumstances in a flexible manner.

More preferably, the cam surface of the driving-side member of the driving force-converting means comprises a first driving force-absorbing region provided on one end of the cam surface for absorbing the driving force received from the driving member and a second driving force-absorbing region provided on the other end of the cam surface for absorbing the driving force received from the driving member.

According to this preferred embodiment, it is possible to prevent or reduce the impact applied to the electronic component parts and the tape-advancing mechanism at the stages later than the driving force-converting means when the driving member starts and terminates driving the tape-advancing mechanism. Further, the tape-advancing operation is terminated at a predetermined position without a shock irrespective of variation in the stop position of the driving member.

Further preferably, a portion extending between the first driving force-absorbing region and the second driving force-absorbing region corresponds to an amount of feed of the tape required in positioning the electronic part at the predetermined takeout position.

According to this preferred embodiment, even if there is variation in a position at which the driving member starts driving of the tape-advancing mechanism, the amount of feed of the tape is determined by the portion extending between the first driving force-absorbing region and the second driving force-absorbing region, and hence the variation can be absorbed to accurately obtain the predetermined amount of feed of the tape.

Further preferably, the cam surface of the driving-side member of the driving force-converting means comprises an accelerating region continuous with the first driving force-absorbing region for smoothly accelerating the speed of the tape-advancing motion of the tape-advancing mechanism, and a decelerating region located immediately before the second driving force-absorbing region for smoothly decelerating the speed of the tape-advancing motion of the tape-advancing mechanism.

The above and other objects, features, and advantages of the invention will become more apparent from the following detailed description taken in conjunction with the accompanying drawings.

DETAILED DESCRIPTION

The invention will now be described in detail with reference to the drawings showing an embodiment of the invention which is applied to an electronic parts-mounting apparatus.

Figure 2:
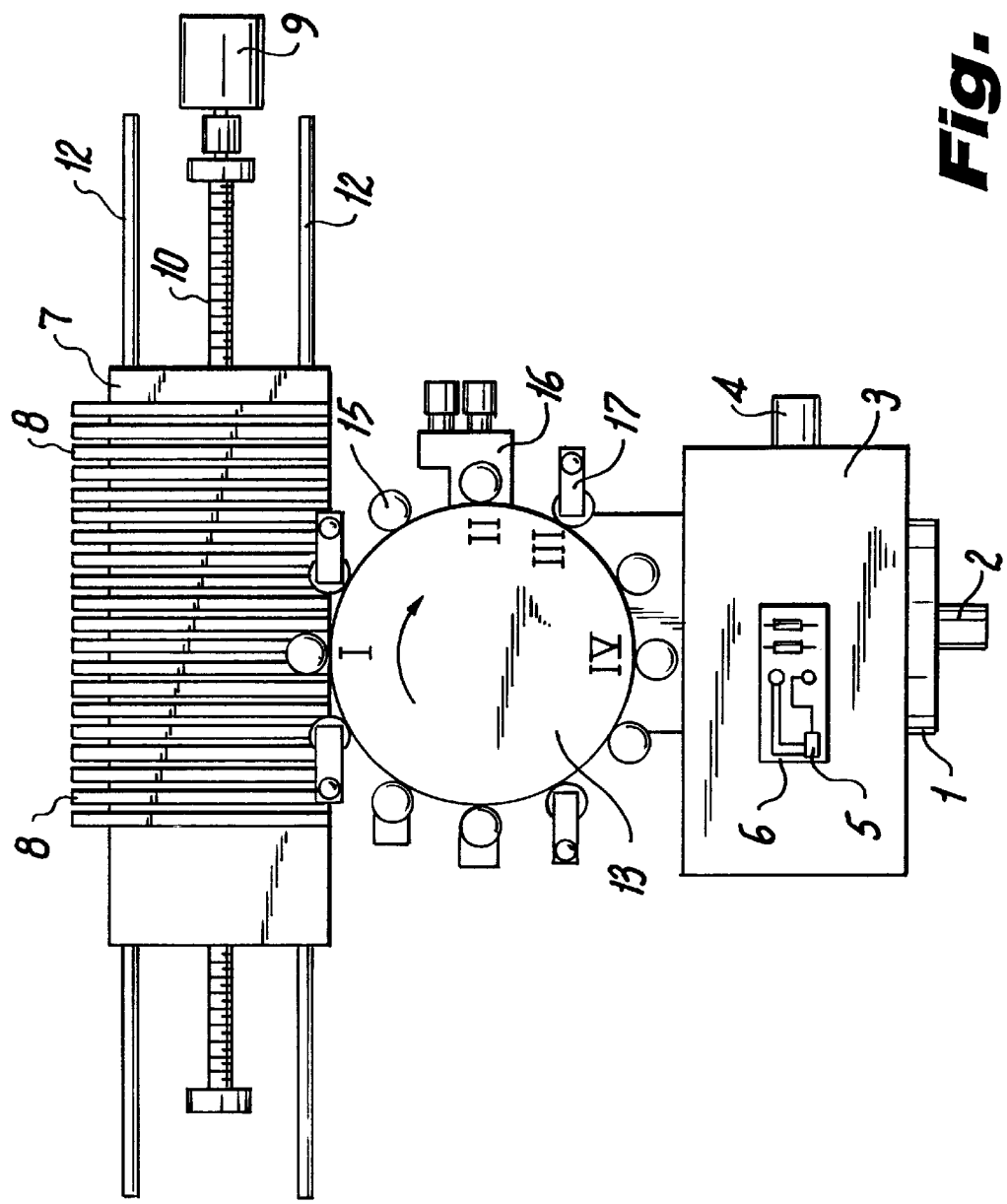
FIG. 2 is a plan view schematically showing an electronic parts-mounting apparatus employing the tape feeder.
Figure 3:
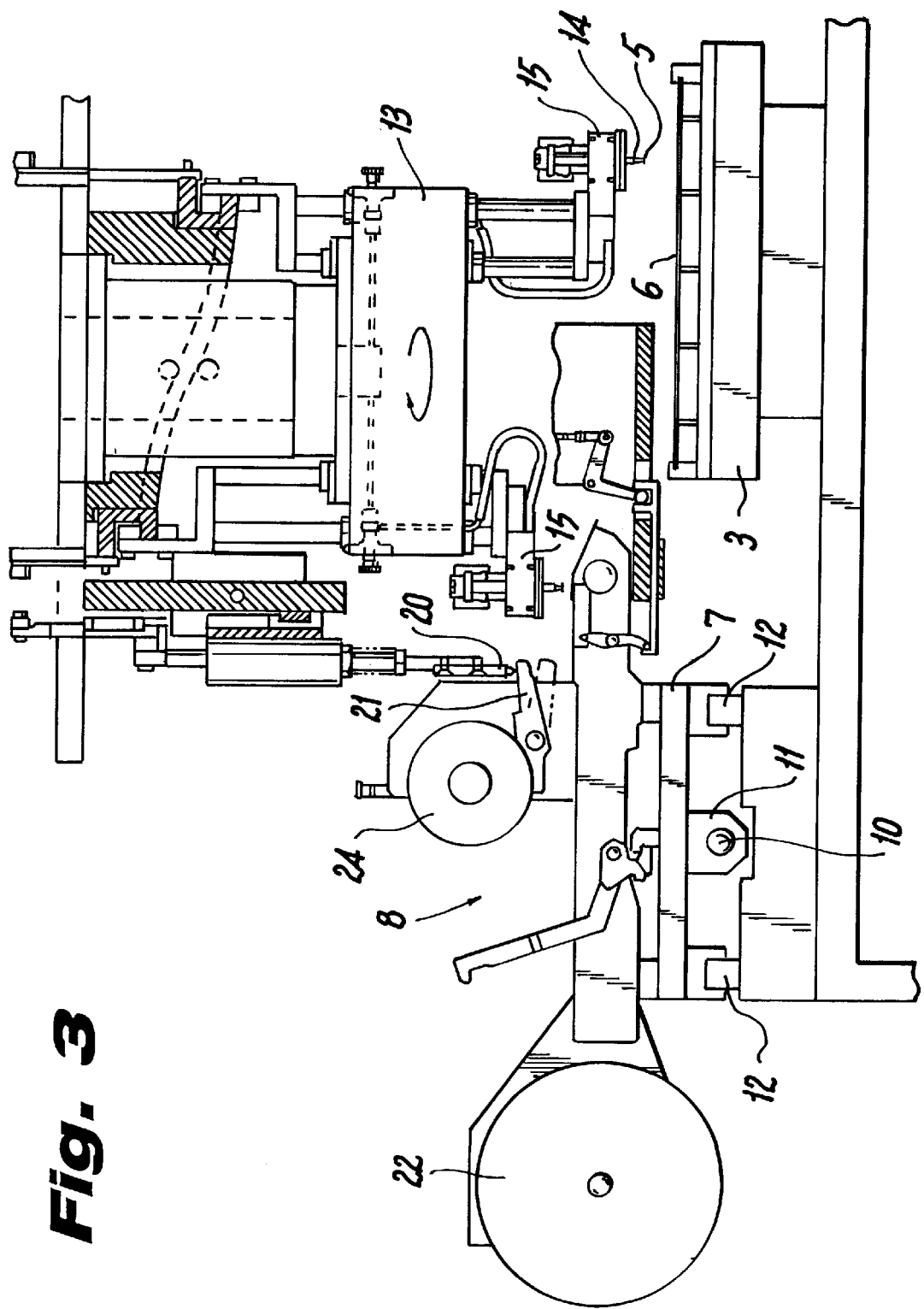
FIG. 3 is a side view of the electronic parts-mounting apparatus.

Referring first to FIGS. 2 and 3, reference numeral 1 designates a Y table which is moved in the direction of a Y axis according to rotation of a Y-axis motor 2, and reference numeral 3 an X-Y table which is moved in the direction of an X axis on the Y table 1 according to rotation of an X-axis motor 4, and as a result moved in the directions of the X axis and the Y axis. On the X-Y table 3 is placed a printed circuit board 6 which is fixed thereto by fixing means, not shown, for mounting electronic parts 5 in the form of chips (hereinafter referred to as "the chip(s)" or "the electronic part(s)") thereon.

Reference numeral 7 designates a parts feed table on which are arranged in a replaceable manner a large number of tape feeders 8 for feeding the chips 5. Reference numeral 9 designates a feed table-driving motor which rotates a ball screw 10 to move the parts feed table 7 along linear guides 12 in the direction of the X axis by way of a nut 11 through which the ball screw 10 extends in engagement therewith and which is fixed to the parts feed table 7. Reference numeral 13 designates a rotary table which rotates intermittently, and mounting heads 15 each having a plurality of sucking nozzles 14 are arranged on the periphery of the rotary table 13 at equally spaced intervals each corresponding to a pitch of intermittent rotation of the rotary table.

Reference numeral I designates a sucking station at which the mounting head 5 is stopped for one of the sucking nozzles 14 thereof to pick up the chip 5 by sucking from the tape feeder 8. In short, at the sucking station I, the sucking nozzle 14 sucks the electronic part 5.

Reference numeral 16 designates a part-recognizing device which uses a camera for picking up an image of a bottom surface of the electronic part 5 sucked by the sucking nozzle 14 within a predetermined range of view, and processes the image to recognize displacement or deviation of the electronic part 4 sucked by the sucking nozzle 14 from its proper position. The part-recognizing device 16 is arranged at a recognizing station II.

The next stop position at which the mounting head 15 is stopped is an angle-correcting station III at which based on results of recognition by the part-recognizing device 16, a head-rotating device 17 rotates the mounting head 15 in the direction of θ through an amount of angle corresponding to the sum of a predetermined angle and an angle for correcting the recognized displacement or deviation of the electronic part. The direction of θ means the direction of rotation of the sucking nozzle 14 about its axis extending in a vertical direction.

The second next stop position from the angle-correcting station III is a mounting station IV at which the electronic part 5 sucked by the sucking nozzle 14 is mounted on the printed circuit board 6 by lowering of the mounting head 15.

Reference numeral 20 designates a vertically reciprocating rod as a driving member which moves vertically in a reciprocating manner. The rod 20 is driven by a cam, not shown, which is driven for rotation by a driving motor, not shown, as a drive source of the index unit intermittently rotating the rotary table 13. The rod 20 is brought into engagement with a swing lever 21 as an engaging member of the tape feeder 8 to cause swinging motion of the swing lever 21, whereby a tape 23 (see FIG. 1) containing the chips 5 at predetermined spaced intervals is fed or advanced intermittently to the length of each of the predetermined space intervals, whereby the tape 23 is positioned such that the chip 5 is brought to a point within the tape feeder 8, which coincides with a point from which the sucking nozzle 14 should take out the chip 5 from the tape 23. Reference numeral 22 designates a tape reel around which is wound the tape 23. Further, the tape 23 has a cover tape, not shown, attached thereto in its parts-holding state or when it is around the tape reel 22, thereby preventing the chips 5 from falling off the tape 23. The cover tape offers an obstacle when the electronic part 5 is sucked by the sucking nozzle 14, and hence its is peeled off by a peeling mechanism, not shown, and wound around a cover tape reel 24, before the chip is taken out or sucked.

Now, the tape feeder 23 will be described with reference to FIGS. 1 and 4 to 7.

Figure 1:
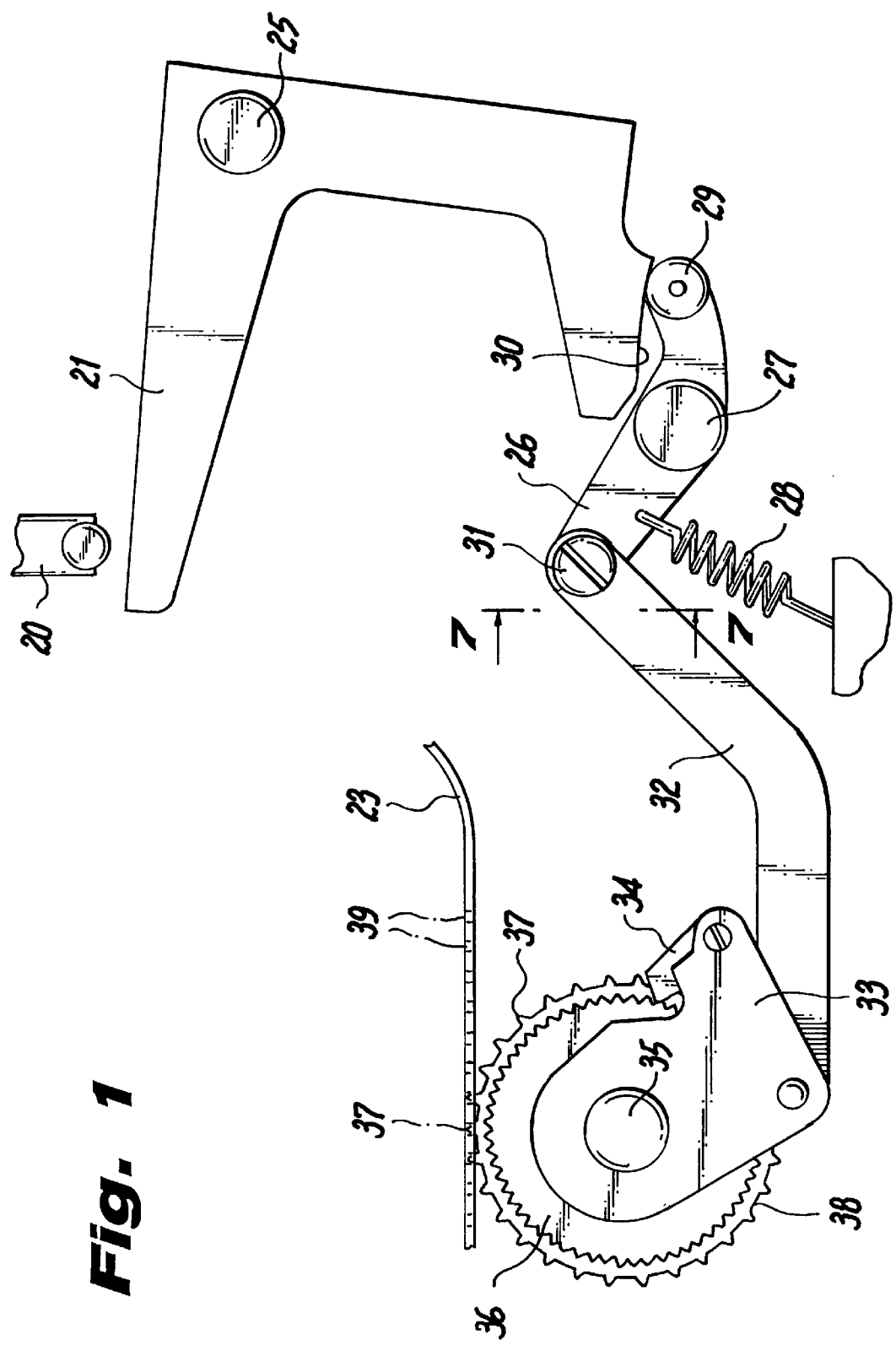
FIG. 1 is a side view showing essential parts of a tape feeder according to an embodiment of the invention.

The swing lever 21 is swingable about a support shaft 25, and urged by a spring, not shown, in a clockwise direction. The motion of the swing lever 21 in the clockwise direction is restricted by a stopper, not shown, such that the swing lever 21 is stopped at a position shown in FIG. 1. Therefore, when the rod 20 is lifted as shown in FIG. 1, a gap is formed between the rod 20 and the swing lever 21.

The motion of the swing lever 21 is transmitted to a transmission lever 26 supported by a shaft 27 in a manner rotatable thereabout. A cam follower 29 is rotatably mounted on one end of the transmission lever 26 which is urged in an anticlockwise direction by an extension spring 28. The cam follower 29 is engaged with a cam surface 30 formed on the swing lever 21, whereby the cam follower 29 is caused to roll on the cam surface 30 while being displaced thereby to cause a swinging motion of the transmission lever 26.

The other end of the transmission lever 26 and one end of a link lever 32 associated therewith are fixedly supported on an eccentric pin 31, thereby being linked to each other. The other end of the link lever 32 is rotatably linked to an advancing lever 33.

The advancing lever 33 has an advancing pawl 34 rotatably mounted thereon, and is urged in an anticlockwise direction by a spring, not shown. The advancing pawl 34 is brought into engagement with teeth on an advancing gear 36 rotatably supported on a shaft 35 which also rotatably supports the advancing lever 33. The advancing lever 33 and the advancing gear 36 are rotatable about the shaft 35 independently of each other.

A sprocket 38 formed with engaging pins 37 at predetermined spaced intervals around the periphery thereof is rigidly attached to the advancing gear 36, and with rotation of the advancing gear 36 in the anti-clockwise direction, the sprocket 38 is rotated to bring one of the engaging pins 37 into one of engaging holes 39 formed in the tape 23 at spaced intervals each corresponding to an interval between adjacent ones of the engaging pins on the advancing gear 36, i.e. pitch thereof, to thereby roil out and advance the tape 23 from the tape reel 22.

The cam surface 30 formed on the swing lever 21 includes stationary regions 40, 41 in which in spite of the swinging motion of the swing lever 31, the cam follower 29 in engagement with the cam surface 30 is not displaced. The stationary region 40 (extending between two broken lines shown in FIG. 5) is made use of when the tape feeder starts the tape-advancing operation while the stationary region 41 (extending between two broken lines shown in FIG. 6) when the tape feeder terminates the same. After passing the stationary region 40, the cam follower 29 starts to be displaced, whereby the transmission lever 26 departs from a state in which the acceleration of the swinging motion of the transmission lever 26 is equal to zero and the speed of the same is equal to zero. In other words, the cam follower 29 starts to be smoothly or gently accelerated for displacement to cause a smooth swinging motion of the transmission lever 26. After reaching the maximum speed of displacing motion, the cam follower 29 is smoothly decelerated until it comes to the stationary region 41, where the speed of the swinging motion of the transmission lever 26 is equal to zero and the acceleration of the same is equal to zero, whereby the transmission lever 26 is stopped without a shock to stop the tape-advancing operation of the tape feeder. The rod 20 may reach its lower limit position at any point so lone as it corresponds to a position of the cam follower 29 in contact with the stationary region 41 of the cam surface 30. To adjust the stop position (limit of feed) of the tape, a nut 43 (see FIG. 7) fastening the eccentric pin 31 to the transmission lever 26 and the link lever 32 is loosened to adjust a supporting point on the transmission lever 26 at which the link lever 32 is linked to the transmission lever 26 for rotation, and then the nut 43 is fastened to firmly fix the link lever 32 and the transmission lever 26 on the eccentric pin 31. Conversely, the stationary region 41 is provided such that after the adjustment of the stop position (limit of feed) of the tape 23 is effected, the tape 23 always becomes stationary when the rod 20 has reached its lower limit position in spite of variations in dimensions of the levers 21, 26, etc., and variation in the lower limit position of the rod 20 (which can be caused by wear of the rod 20).

Moreover, as the cam follower 29 moves on the cam surface 30 through a region (hereinafter referred to as "the displacing region") from the end boundary of the stationary region 40 to the start boundary of the stationary region 41, the transmission lever 26 is necessarily rotated through a predetermined angle to move the tape through a predetermined distance. The mechanism for transmitting displacing motion or force from the swing lever 21 to the sprocket 38 for advancing the tape 23 constitute a tape-advancing mechanism. Further, the cam follower 29 and the cam surface 30 constitute driving force-converting means for converting driving force received from the rod (driving member) to a driving force for use in the tape-advancing motion of the tape-advancing mechanism such that the tape-advancing motion of the tape-advancing mechanism can be controlled, i.e. executed or inhibited as desired, and the speed of tape-advancing motion of the tape-advancing mechanism is smoothly accelerated and decelerated.

Further, as for the stationary region 40, it may be required to change the position of the aforementioned stopper, not shown, to obtain a predetermined length of gap between the rod 20 and the swing lever 21 to overcome variation in the position of the rod 20 etc., such that in spite of the relative movement of the cam follower 29 on the cam surface 30, the tape 23 is stationary, i.e. at an advancing speed of zero.

Further, although only one rod 20 is used in the present embodiment, this is not limiting, but in addition to the rod 20 arranged at a position for taking out the chip 5 by the sucking nozzle 14, a similar rod may be provided at a position adjacent thereto for feeding the tape 23 to supply a next electronic part 5 to a takeout position during chip-sucking operation of the sucking nozzle 14. In such a case, in spite of variation in the lower limit position among a plurality of rods provided as above, the stop position of the tape 23 is identical so long as the lower limit position of each rod is such that the cam follower 29 is within the stationary region 41 when the lower limit position is reached by the rod. Further, variation in the abutment position of each rod at which the rod abuts or strikes the swing lever 21 when the tape-feeding operation is to be started is absorbed by the function of the stationary region 40.

Next, the operation of the tape feeder of the electronic parts-mounting apparatus will be described.

First, when the automatic operation of the electronic parts-mounting apparatus is started, the rotary table 13 is rotated to move the mounting head 15 to the sucking station I. As the mounting head 15 is moved to the sucking station I, the parts feed table 7 is moved such that the tape feeder 8 indicated by parts-mounting control NC data, not shown, is moved to a position from which the chip is to be sucked by the sucking nozzle 14 lowered.

Figure 5:
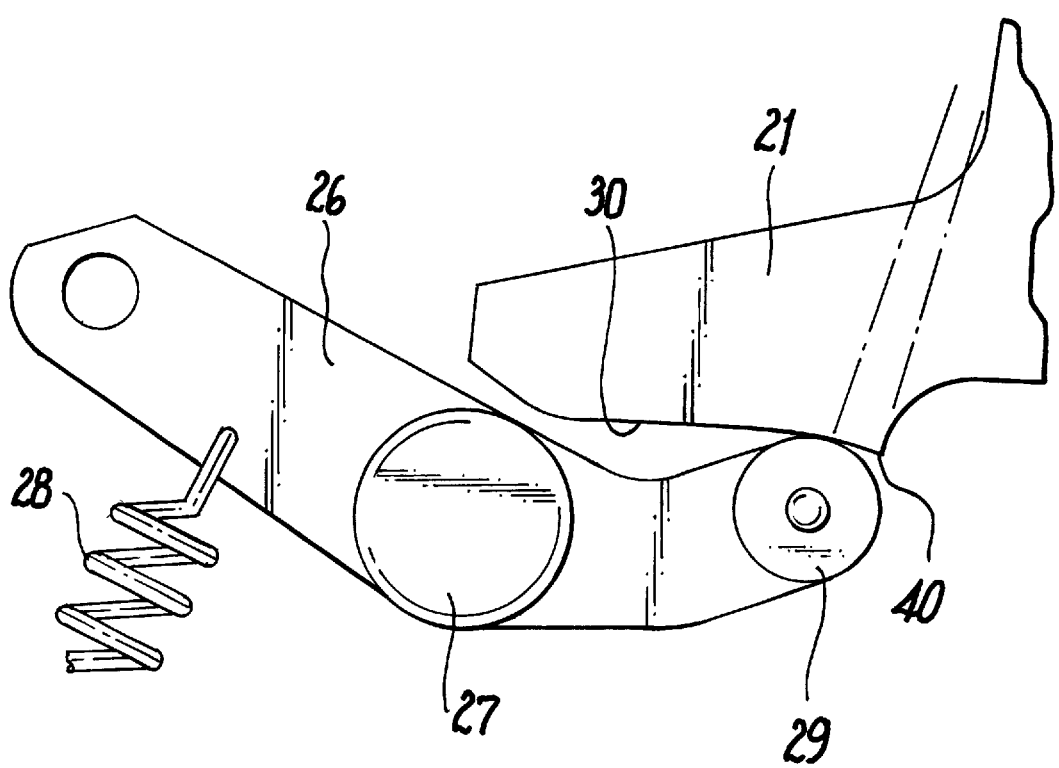
FIG. 5 is a side view showing a state of a cam surface and a cam follower of the tape feeder in which the cam follower is engagement with the cam surface at the start of the tape-advancing operation.

Then, as the cam, not shown, rotates to start moving the rod 20 downward from its initial position shown in FIG. 1 to a position where the rod 20 is engaged with the swing lever 21 for swinging the swing lever 21 in the anticlockwise direction. At this time, the cam follower 29 is in contact with the cam surface 30 at a point within the stationary region 40, and hence the transmission lever 26 remains stationary (is not displaced). This prevents an impact upon striking of the rod 20 against the swing lever 21 from acting on the transmission lever 26, so that the impact is not transmitted to the tape but only causes a swinging motion of the swing lever 21. Even if the tape feeder is set such that the cam follower 29 at its initial position is located, as shown in FIG. 5, at a boundary between the stationary region 40 and the displacing region (terminating point of the stationary region 40), to thereby permit starting to move the transmission lever 26 immediately after the rod 20 is engaged with the lever 21, the speed and acceleration of displacement of the cam follower 29 at the start thereof are so small that almost no shock is transmitted to the tape 23.

Next, so long as the cam follower 29, which is driven by the swinging motion of the swing lever 21, moves on the stationary region 40 of the cam surface 30, the transmission lever 26 is stationary. Only after the cam follower 29 passes the terminating point of the stationary region 40 to move into the displacing region, the transmission lever 26 starts its swinging motion. Initially, the speed of the swinging motion of the transmission lever 26 is equal to zero, and the acceleration thereof is gently increased to smoothly increase the speed up to the maximum value without any shock. The swinging motion is transmitted to the advancing pawl 34 via the link lever 32 and the advancing lever 33, and the advancing pawl 34 rotates the advancing gear 36 to cause the sprocket 38 to advance the tape 23 such that the speed of the movement of the tape 23 is gently increased from zero to its maximum value. Therefore, the tape-advancing operation is smoothly carried out without any shock applied to the tape 23 at the start of the operation.

Figure 4:
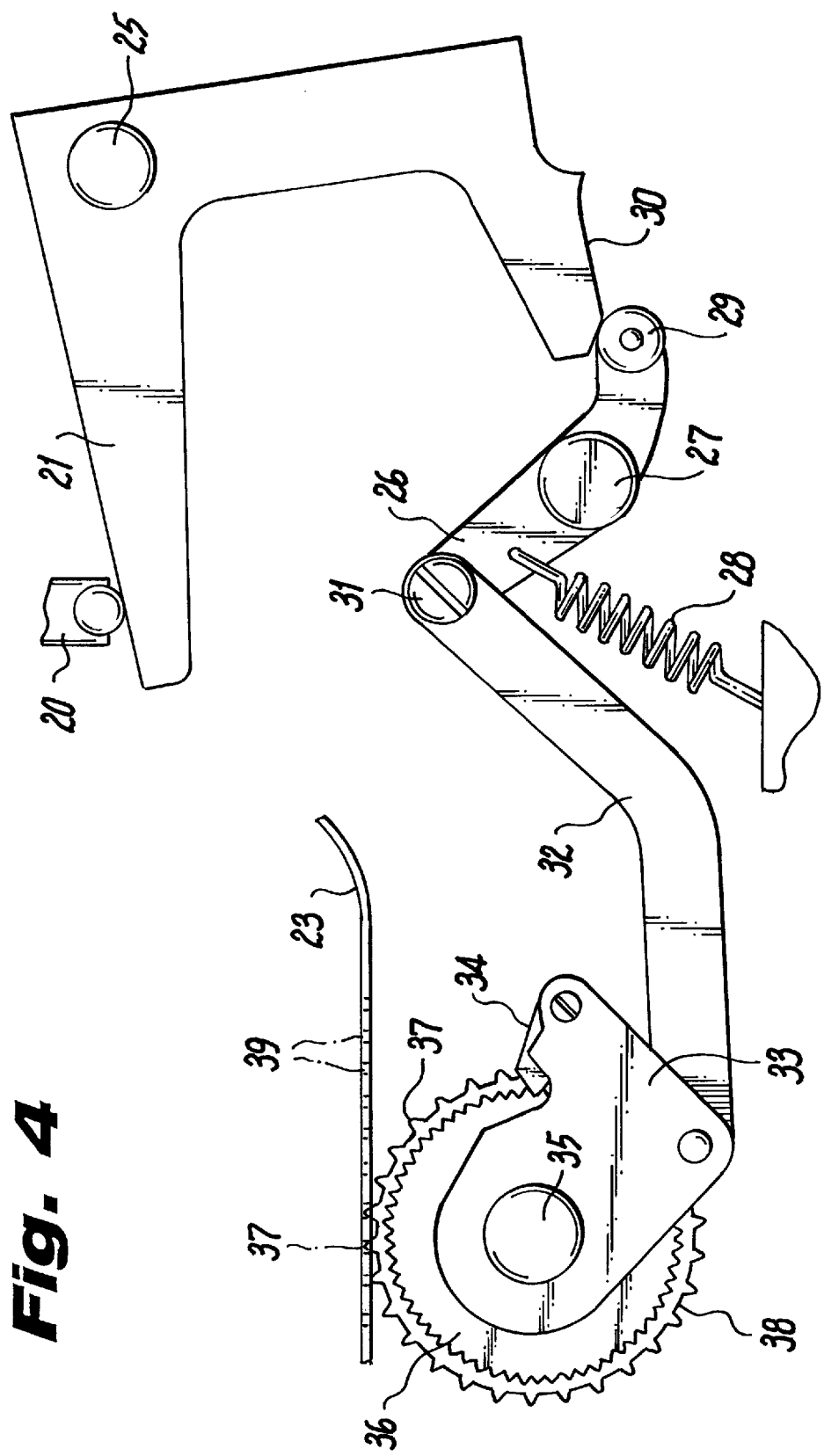
FIG. 4 is a side view showing essential parts of the tape feeder in an advanced limit position of the tape feeder.
Figure 6:
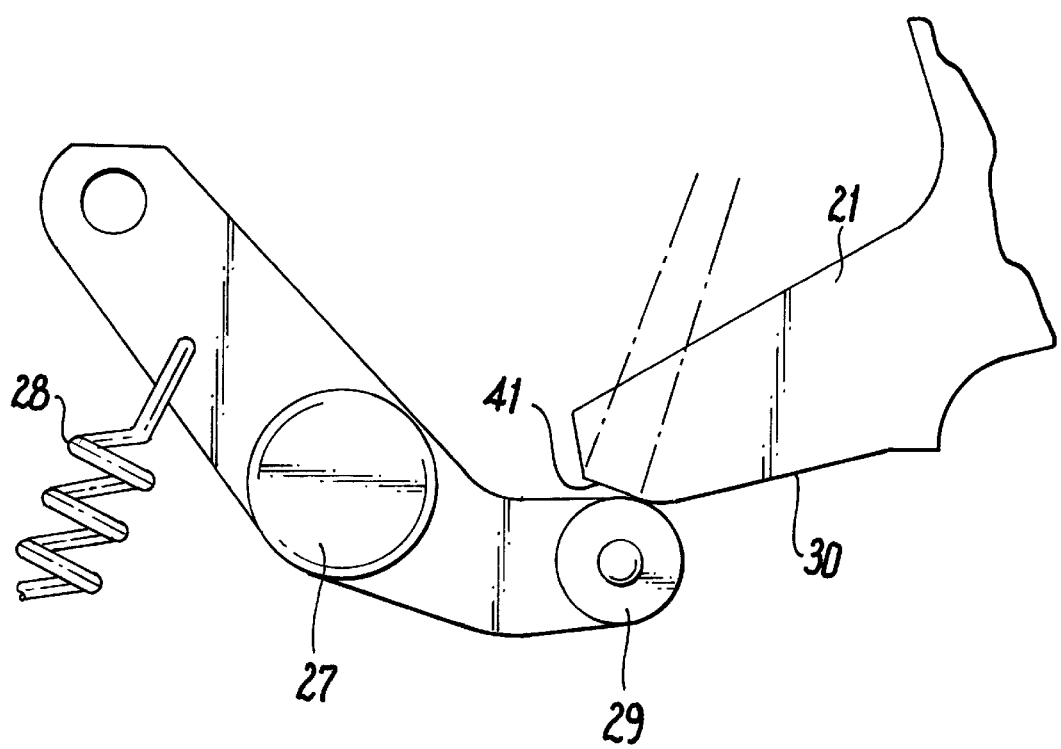
FIG. 6 is a side view showing a state of the cam surface and the cam follower of the tape feeder in which the cam follower is engagement with the cam surface at the end of the tape-advancing operation.
Figure 7:
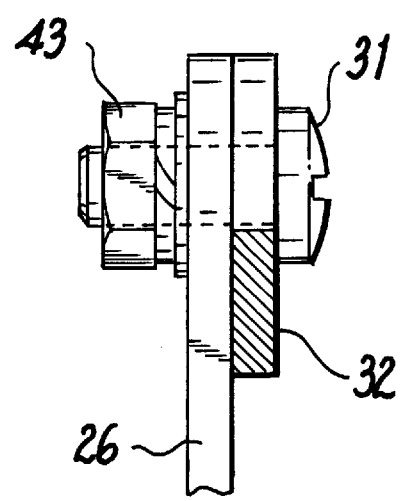
FIG. 7 is a view taken on line 7—7 in FIG. 1.

Then, as the cam follower 29 rolls on the cam surface 30, the speed of the displacing movement of the cam follower 29 is smoothly decelerated according to the cam profile of the cam surface 30 until the cam follower 29 reaches a boundary between the displacing region and the stationary region 41 of the cam surface 30, as shown in FIG. 6. When the cam follower 29 reaches this boundary, the tape 23 is stopped without any shock at a predetermined stop position set by adjustment such that it corresponds to a predetermined limit of feed of the tape 23. Thus, the tape is positioned as shown in FIG. 4.

Even if the rod 29 further moves downward thereafter due to variation in the configuration and position of the rod 20, etc., the cam follower 29 rolls on the stationary region 41 of the cam surface 30 so that the transmission lever 26 is not displaced, and hence the tape 23 keeps stationary. The rod 20 reaches its lower limit position while the cam follower 29 is within the stationary region 41 (since the tape feeder is so adjusted to cause the rod 20 to stop before the cam follower 29 moves beyond the stationary region 41), and subsequently moves upward.

Thus, the tape 23 is advanced only while the cam follower 29 rolls on the cam surface 30 from the end point of the stationary region 40 to the start point of the stationary region 41, so that the tape 23 is always advanced through the same distance, and then stopped. Since the electronic parts 5 are held or contained on the tape 23 at intervals of this distance of feed, each electronic part 5 is stopped at the same stop position, i.e. at the takeout position from which it should be take out.

Next, the sucking nozzle 14 is lowered with lowering of the mounting head 15, and the chip 5 is sucked by vacuum. The lowering of the mounting head 15 is also driven by a cam, not shown, which is driven for rotation by the motor rotating the rotary table 13. The intermittent rotation of the rotary table 13, the tape-advancing operation of the tape feeder, and the lowering of the sucking nozzle are carried out in a synchronous manner.

Next, when the rod 20 starts to move upward, the swine lever 21 is moved backward in the anticlockwise direction by the urging force of the spring, not shown, and the spring 28 causes the transmission lever 26 to be swung such that the cam follower 29 returns to its initial position by rolling on the cam surface 30 in a direction opposite to that in which the cam follower 29 rolls when the tape is advanced. The advancing pawl 34 returns to its initial position by moving over the teeth of the gear 36.

Then, the rotary table 3 performs its intermittent rotation to move the mounting head 15 having sucked the electronic part 5 thereat to the next stop position, and the following mounting head 14 comes to the sucking station I to take out a chip 5 in the same manner as described above.

The chip 5 taken out at the sucking station I is then conveyed to the recognizing station II, where the part-recognizing device 16 recognizes the position or orientation of the chip, and based on the results of the recognition, the chip is placed in a desired angle position or orientation at the angle-correcting station III. Then, at the mounting station IV, the chip is mounted on a desired point on the printed circuit board 6, which is set by movement of the X-Y table 3.

It should be noted that when the motion of the advancing lever 33 causes the advancing pawl 34 to mate with teeth of the advancing gear 36 to rotate the same, if the speed of mating of the advancing pawl 34 with the advancing gear 36 is high, a shock occurs to adversely affect the tape-advancing motion of the advancing gear 36. Therefore, it is preferred that the mating speed is not high, and this preference can be satisfied by modifying the configuration of the cam surface 30. Further, if a speed variation curve of tape-advancing operation (curve indicative of changes in the speed of tape-advancing motion from the start of advancing the tape 23 to the end of advancing the same) should be modified due to various factors and/or requirements in the tape-feeding operation of the tape feeder, it is only required that the configuration of the cam surface 30 is modified.

Further, the problem of adverse effects of a shock applied to the tape-feeding operation of the tape feeder occurs when the tape 23 is stopped (i.e. immediately before the electronic part is taken out or sucked by the sucking nozzle; vibrations resulting from the shock cause most serious adverse effects on the chip-sucking operation carried out thereafter). Therefore, the cam profile should be designed or selected such that the shock occurring at this time becomes the minimum.

Further, to change the pitch of feed, i.e. distance of feed of the tape effected by one tape-advancing operation, the swing lever 21 can be replaced with one having a cam surface 30 corresponding to the required pitch of feed. This dispenses with need for replacement of the other component parts of the tape feeder 8.

Further, although in the present embodiment, the cam surface 30 as one element of the driving force-converting means is provided on the swing lever 21 as a driving member, and the cam follower 29 as the other element of the same is provided on the transmission lever 26, this is not limitative, but the cam surface may be formed on any suitable member (driving-side member) of a driving force-transmitting mechanism of the tape feeder, and the cam follower on another member (driven-side member) associated the driving-side member, thereby allowing the driving force to be transmitted from the driving-side member to the driven-side member to convert the externally-supplied driving force to a driving force for use in advancing the tape 23.

Further, in place of the cam surface 30 and the cam follower 29 constituting the driving force-converting means, a crank mechanism may be used for means of converting the driving force, whereby the tape-advancing motion may be started smoothly along a cycloid curve of the crank mechanism which defines the speed variation curve thereof, and then decelerated to stop the tape-feeding operation without a shock. In this case, although it is possible to provide portions corresponding to the stationary regions 40, 41, it is impossible to completely inhibit the displacement of the driven-side member of the driving force-converting means, but by reducing the displacement of the driven-side member almost to zero, it is possible to absorb variations in the lower limit position of the vertically-reciprocating rod (driving member), etc., similarly to the present embodiment employing the cam mechanism.

It is further understood by those skilled in the art that the foregoing is a preferred embodiment of the invention, and that various changes and modifications may be made without departing from the sprit and scope thereof.

What is claimed is:

1. In a tape feeder comprising:

a driving member which performs reciprocating motion to produce a driving force, and a tape-advancing mechanism directly driven by the driving force of said driving member for intermittently advancing a tape containing electronic parts in a linear direction to thereby position each of said electronic parts at a predetermined takeout position, driving force-converting means responsive to the driving force received from said driving member to directly drive said tape-advancing mechanism with a speed of tape-advancing motion that is varied from zero at a start position up to a speed for linearly advancing the tape, and then down to zero speed at a stop position for said tape-advancing mechanism.

2. A tape feeder according to claim 1, wherein said driving force-converting means converts said driving force received from said driving member into said driving force for use in said tape-advancing motion of said tape-advancing mechanism such that the speed of said tape-advancing motion of said tape-advancing mechanism is gradually accelerated from zero at the start position to the speed for advancing the tape after said tape-advancing motion of said tape-advancing mechanism is started.

3. A tape feeder according to claim 2, wherein said driving force-converting means converts said driving force received from said driving member into said driving force for use in said tape-advancing motion of said tape-advancing mechanism such that the speed of said tape-advancing motion of said tape-advancing mechanism is gradually decelerated from the speed at which the tape is advanced to the stop position of zero speed when said tape-advancing motion of said tape-advancing mechanism is stopped.

4. A tape feeder according to claim 1, wherein said driving force-converting means converts said driving force received from said driving member into said driving force for use in said tape-advancing motion of said tape-advancing mechanism such that the speed of said tape-advancing motion of said tape-advancing mechanism is gradually decelerated from the speed at which the tape is advanced to the stop position of zero speed when said tape-advancing motion of said tape-advancing mechanism is stopped.

5. A tape feeder according to claim 1, wherein said tape-advancing mechanism includes an engaging member with which said driving member detachably engages for displacing said engaging member, and wherein said driving force-converting means absorbs said driving force received from said driving member when said driving member starts displacing said engaging member such that displacement of said engaging member, occurring at or in the vicinity of a position at which said driving member in engagement with said engaging member starts displacing of said engaging member, does not cause said tape-advancing motion of said tape-advancing mechanism.

6. A tape feeder according to claim 5, wherein said tape-advancing mechanism includes an engaging member with which said driving member detachable engages for displacing said engaging member, and wherein said driving force-converting means absorbs said driving force received from said driving member when said driving member terminates displacing said engaging member such that displacement of said engaging member, occurring at or in the vicinity of a position at which said driving member in engagement with said engaging member terminates displacing of said engaging member, does not cause said tape-advancing motion of said tape-advancing mechanism.

7. A tape feeder according to claim 1, wherein said tape-advancing mechanism includes an engaging member with which said driving member detachably engages for displacing said engaging member, and wherein said driving force-converting means absorbs said driving force received from said driving member when said driving member terminates displacing said engaging member such that displacement of said engaging member, occurring at or in the vicinity of a position at which said driving member in engagement with said engaging member terminates displacing of said engaging member, does not cause said tape-advancing motion of said tape-advancing mechanism.

8. A tape feeder according to claim 1, wherein said driving force-converting means includes a driving-side member and a driven-side member, one of said members provided with a cam surface and the other of said members with a cam follower which is engaged with said cam surface for displacement, said cam surface having a profile formed with first, second and third regions such that as said driving member reciprocates the cam surface is moved relative to the cam follower over the three regions to vary the speed of said tape-advancing motion of said tape-advancing mechanism from zero, to the speed for advancing the tape, and back to zero.

9. A tape feeder according to claim 8, wherein said first region of said cam surface of said driving-side member of said driving force-converting means is at one end of said cam surface for absorbing said driving force received from said driving member and said third region is at the other end of said cam surface for absorbing said driving force received from said driving member.

10. A tape feeder according to claim 9, wherein said third region of said cam surface extends between said first and said second regions and corresponds to an amount of feed distance of said tape required in positioning said each of said electronic parts at said predetermined takeout position.

11. A tape feeder according to claim 10, wherein said cam surface further comprises a section continuous with said first region for gradually accelerating said speed of said tape-advancing motion of said tape-advancing mechanism from zero, and a decelerating section located immediately before said third region for gradually decelerating said speed of said tape-advancing motion of said tape-advancing mechanism back to zero.

12. A tape feeder as in claim 10 wherein said cam surface first region and said second region are each inclined in the same general direction relative to said third region extending between said first and second force-absorbing regions.

13. A tape feeder as in claim 12 wherein the speed of said tape-advancing motion of said tape-advancing mechanism when said cam follower engages said cam surface first region is zero, then accelerates gradually to a maximum value and next decelerates gradually in said portion between said first and second regions, and is zero at said second region.

14. A tape feeder as in claim 10 wherein the speed of said tape-advancing motion of said tape-advancing mechanism when said cam follower engages said cam surface first region is zero, then accelerates gradually to a maximum value and next decelerates gradually in said portion between said first and second regions, and is zero at said second region.

15. A tape feeder according to claim 9, wherein said cam surface further comprises accelerating section continuous with said first region for gradually accelerating said speed of said tape-advancing motion of said tape-advancing mechanism from zero, and a decelerating section located immediately before said third region for gradually decelerating said speed of said tape-advancing motion of said tape-advancing mechanism back to zero.

16. A tape feeder as in claim 1 wherein said tape-advancing mechanism comprises a rotatable sprocket on which said tape is carried and said force converting means includes a link responsive to the driving force to rotate said sprocket.

* * * * *